(12) United States Patent
Pabari

(10) Patent No.: US 7,430,697 B1
(45) Date of Patent: Sep. 30, 2008

(54) METHOD OF TESTING CIRCUIT BLOCKS OF A PROGRAMMABLE LOGIC DEVICE

(75) Inventor: Deepak M. Pabari, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 49 days.

(21) Appl. No.: 11/186,373

(22) Filed: Jul. 21, 2005

(51) Int. Cl.
G01R 31/28 (2006.01)
(52) U.S. Cl. .......................... 714/724; 702/119; 716/4; 714/727; 714/725; 714/726; 326/38; 326/39; 326/41; 326/40
(58) Field of Classification Search .......... 714/100–824
See application file for complete search history.

(56) References Cited

U.S. PATENT DOCUMENTS

| | | | |
|---|---|---|---|
| 5,883,525 A * | 3/1999 | Tavana et al. .................. 326/39 |
| 5,991,788 A * | 11/1999 | Mintzer ....................... 708/622 |
| 6,003,150 A * | 12/1999 | Stroud et al. ................. 714/725 |
| 6,034,542 A * | 3/2000 | Ridgeway .................... 326/39 |
| 6,041,340 A * | 3/2000 | Mintzer ....................... 708/403 |
| 6,297,665 B1 * | 10/2001 | Bauer et al. ................... 326/40 |
| 6,481,000 B1 * | 11/2002 | Zaveri et al. .................. 716/17 |
| 6,664,808 B2 | 12/2003 | Ling et al. |
| 6,668,237 B1 * | 12/2003 | Guccione et al. ............ 702/119 |
| 6,691,267 B1 * | 2/2004 | Nguyen et al. .............. 714/725 |
| 6,725,442 B1 * | 4/2004 | Cote et al. .................... 716/16 |
| 6,759,869 B1 * | 7/2004 | Young et al. .................. 326/41 |
| 6,842,039 B1 * | 1/2005 | Guzman et al. ............... 326/38 |
| 6,876,698 B1 * | 4/2005 | Dick et al. ................... 375/229 |
| 6,889,368 B1 * | 5/2005 | Mark et al. ..................... 716/4 |
| 6,891,395 B2 * | 5/2005 | Wells et al. ................... 326/38 |
| 6,944,836 B1 * | 9/2005 | Lai ................................ 716/4 |
| 6,968,487 B1 * | 11/2005 | Bryant et al. ............... 714/726 |
| 7,007,250 B1 * | 2/2006 | Bapat et al. .................... 716/4 |
| 7,028,281 B1 * | 4/2006 | Agrawal et al. .............. 716/12 |
| 7,080,300 B1 * | 7/2006 | Herron et al. ............... 714/726 |
| 7,112,992 B1 * | 9/2006 | Guzman et al. ............... 326/38 |
| 7,124,347 B2 * | 10/2006 | Plants ......................... 714/763 |
| 2001/0037482 A1 * | 11/2001 | Plants ......................... 714/763 |
| 2003/0122578 A1 * | 7/2003 | Masui et al. .................. 326/39 |
| 2004/0103354 A1 * | 5/2004 | Mark et al. .................. 714/725 |
| 2005/0154552 A1 * | 7/2005 | Stroud et al. ................ 702/120 |

* cited by examiner

*Primary Examiner*—Jacques Louis-Jacques
*Assistant Examiner*—Guerrier Merant
(74) *Attorney, Agent, or Firm*—John J. King

(57) ABSTRACT

A method of testing circuits in a programmable logic device is described. According to one embodiment of the invention, a method comprises steps of configuring a configurable logic block of the programmable logic device with a test signal source and a logic circuit; routing the test signal source to the logic circuit; and determining if the logic circuit is defective. According to an alternate embodiment, a method enables re-routing a path from a shift register to a lookup table to determine whether a lookup table is defective. According to a further alternate embodiment, a method enables localized routing to reduce the probability that a defect is a result of a routing defect.

20 Claims, 5 Drawing Sheets

--Prior Art--

# METHOD OF TESTING CIRCUIT BLOCKS OF A PROGRAMMABLE LOGIC DEVICE

FIELD OF THE INVENTION

The present invention relates generally to programmable logic devices, and in particular, to a method of testing circuit blocks of a programmable logic device.

BACKGROUND OF THE INVENTION

A programmable logic device, such as a field programmable gate array (FPGA), is designed to be user-programmable so that users can implement logic designs of their choices. In a typical FPGA, an array of configurable logic blocks (CLBs) are coupled to programmable input/output blocks (IOBs). The CLBs and IOBs are interconnected by a hierarchy of programmable routing resources. These CLBs, IOBs, and programmable routing resources are customized by loading a configuration bitstream into configuration memory cells of the FPGA. As circuit designs implemented in an FPGA are becoming more complex, the number of CLBs, IOBs, and other resources such as multipliers and block RAMs has increased, as well as the generalized routing resources to make the connections between the various blocks. The length of a conductors providing routing resources are often defined by the number of conductor segments coupled between a pair of programmable interconnect points (PIPs). Relatively short conductors (e.g. "double lines" comprising two segments between PIPs) could be included in a first pair of metal layers. Similarly, "hex lines" comprising six segments coupled between PIPs could be formed on another pair of metal layers, while relatively long conductors extending between the edges of the integrated circuit could be formed on another pair of metal layers. As a result, the size of FPGA die and the resources fabricated on the die has grown. Because the number of defects is proportional to the area of a die, the probability of having a defect in a die has also increased.

The circuits implemented by different customers using FPGAs are usually unique. Further, a circuit design may undergo modifications during product development phase. Thus, multiple versions of a circuit may be implemented on an FPGA. Because FPGAs are not design specific and can be used with any design, the quality and reliability of FPGAs is very significant. If an FPGA contains a single defect (e.g., one of its configuration memory cells is defective), it may render an end product unusable because a customer design may need to use that defective resource. In order to avoid problems with customers, an FPGA manufacturer needs to discard an FPGA even if it contains only one defect. The problem of low yield has significant economic impact on FPGA manufacturers.

While a gross defect causes failure of an entire FPGA, a localized defect may cause the failure of a small amount of circuitry in the FPGA. It has been found that a majority of large FPGA dies are discarded because of localized defects. Methods have been found to use some of these defective dies, significantly reducing the product cost of the FPGA manufacturer. In particular, it may be determined that a defect in a given FPGA die will not affect the customer's design, making that given defective die suitable for the customer. For example, a user may program a predetermined circuit design in the defective die. If the design works, the die would be acceptable to the customer. As a result, customers can take advantage of lower priced FPGAs for specific design patterns.

However, it is often the case that a given defective FPGA die may not function for a predetermined circuit design as configured, but may function if reconfigured so that different elements of the defective die are used to implement the correct circuit design. One element of an FPGA which may be defective is a lookup table. The majority of lookup tables of an FPGA are often used when an FPGA is configured with a design. However, testing lookup tables in an FPGA can require significant routing overhead (i.e. the portion of the FPGA that is not part of the predetermined circuit design). As shown for example in FIG. 1, a configurable logic block 102 having a plurality of lookup tables 104 are coupled to an input/output block 106 having a plurality of inputs 108. Four address bits are shown for addressing the lookup tables by way of routing resources 110. The typical technique to test the lookup table of a defective device is to stimulate all used input combinations of the lookup table, for all of the lookup tables to be programmed to implement the design. For example, when all four inputs of the lookup table are used, the lookup table has to be tested using 16 combinations of input values. Conventional techniques provide the stimulus for the 4 inputs through the IOB pads. For each input, an IOB pad is configured and connected to drive that input. Therefore, a total of four IOB pads can drive the four inputs to a lookup table for every slice in the FPGA. This routing overhead may impact the overall yield of known defective FPGA die which are able to be used with a given circuit. That is, the extensive routing to test a defective lookup table, and not the lookup table itself, may be the cause of the defect, and thus causing the device to be unnecessarily rejected.

Accordingly, there is a need for a method of efficiently testing circuits such as lookup tables of a programmable logic device.

SUMMARY OF THE INVENTION

Circuitry and methods of testing circuits, such as lookup tables, in a programmable logic device are described. According to one embodiment, a method comprises steps of configuring a configurable logic block of the programmable logic device with a test signal source and a logic circuit; routing the test signal source to the logic circuit; and determining if the logic circuit is defective. Specific embodiments employing shift registers and lookup tables, as well as methods of switching the functions of the circuits, are also described.

According to another embodiment, a method of testing circuits in a programmable logic device comprises steps of configuring a configurable logic block of the programmable logic device with a shift register and a lookup table; routing test signal from the shift register to the lookup table; detecting an incorrect output of the lookup table; re-routing the path from the shift register to the lookup table; and determining if the lookup table is defective.

According to a further embodiment, a method of testing circuits in a programmable logic device comprises steps of configuring a configurable logic block of the programmable logic device with a plurality of shift registers and a plurality of lookup tables; routing the plurality of shift registers to the plurality of lookup tables using localized routing; and determining defective lookup tables of the plurality of lookup tables.

DETAILED DESCRIPTION OF THE DRAWINGS

Figure 2:
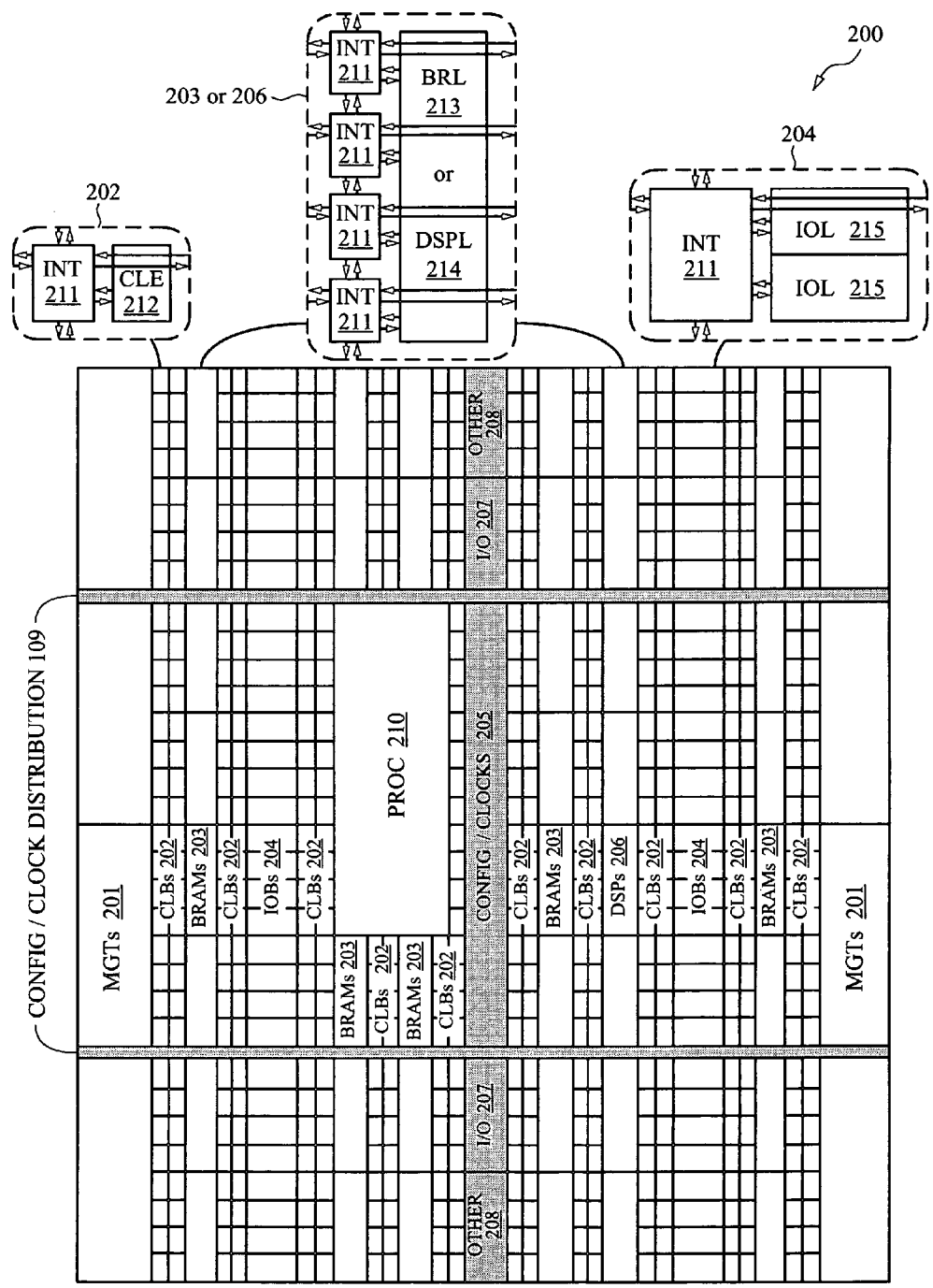
FIG. 2 is a block diagram of a programmable logic device according to an embodiment of the present invention.

Turning first to FIG. 2, a block diagram of a circuit for implementing the methods for testing circuits according to an embodiment of the present invention is shown. In particular, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device.

Figure 1:
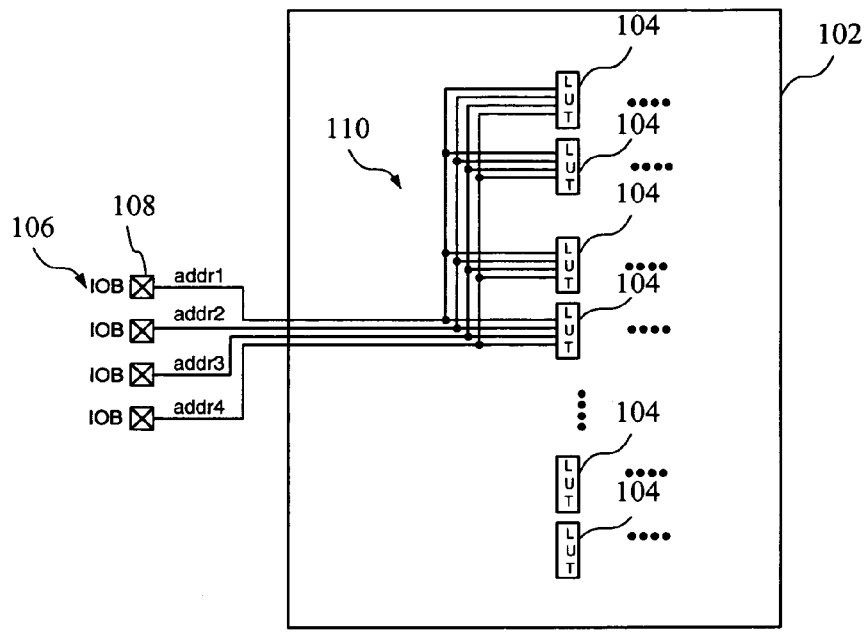
FIG. 1 is a block diagram of a conventional arrangement for testing circuits of a programmable logic device.
Figure 3:
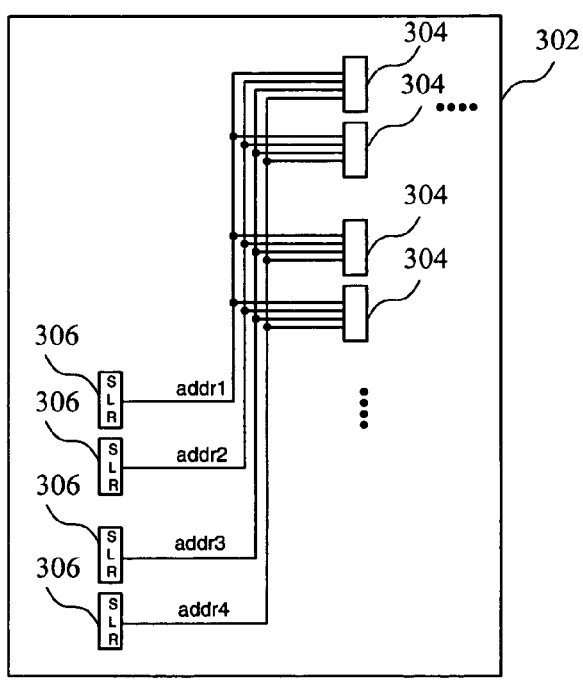
FIG. 3 is a block diagram of a configurable logic block of a programmable logic device according to an embodiment of the present invention.

Turning now to FIG. 3, a block diagram of configurable logic block of a programmable logic device according to an embodiment of the present invention is shown. A configurable logic block 302 comprises a plurality of logic circuits 304 which are load circuits coupled to be addressed by a plurality of source circuits 306. As will be described in more detail in reference to FIGS. 4 and 5, the logic circuits could be lookup tables, while the source circuits for providing address bits could be shift registers, for example. The outputs of the lookup tables are monitored to determine if the correct output is generated, and the lookup table is therefore functioning properly.

The various embodiments of the present invention enable improving yields of defective but usable integrated circuits. The methods generally take advantage of the structure of a configurable logic block in an FPGA. A typical configurable logic block contains a number of subdivisions having a predetermined number of logic cells. These subdivisions are commonly called "slices" and could have for example two lookup tables. A typical configurable logic block could have 4 slices. The methods of embodiments of the present invention enables stimulating all combinations of the inputs for any given lookup table using resources within the configurable logic block. According to one embodiment, the methods could use two slices as "source" slices which provide the stimulus for the other two slices which are "load slices." The two source slices are configured as shift registers (i.e. two shift registers in each slice) for a total of four source shift registers. These four source shift registers are configured to provide the address combinations to each load lookup table. However, fewer source shift registers could be configured if less than four address bits are required to address the lookup table.

Figure 4:
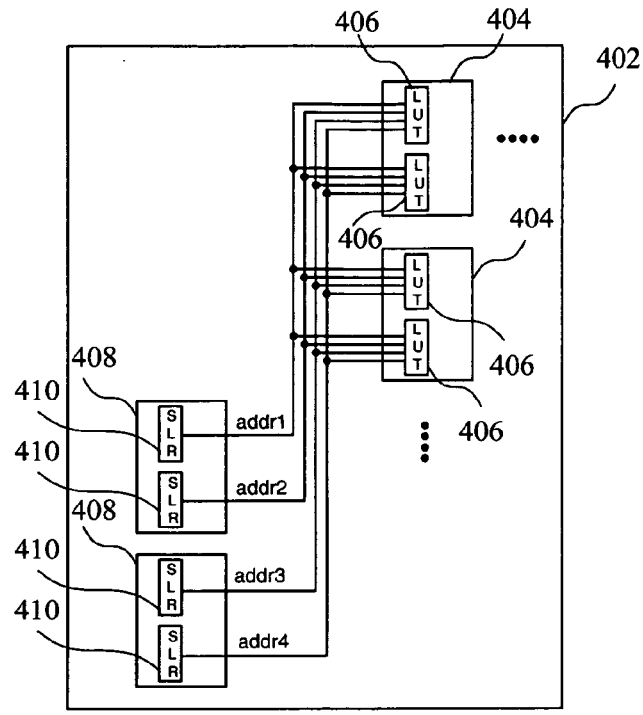
FIG. 4 is a block diagram of a configurable logic block of a programmable logic device according to an alternate embodiment of the present invention.
Figure 5:
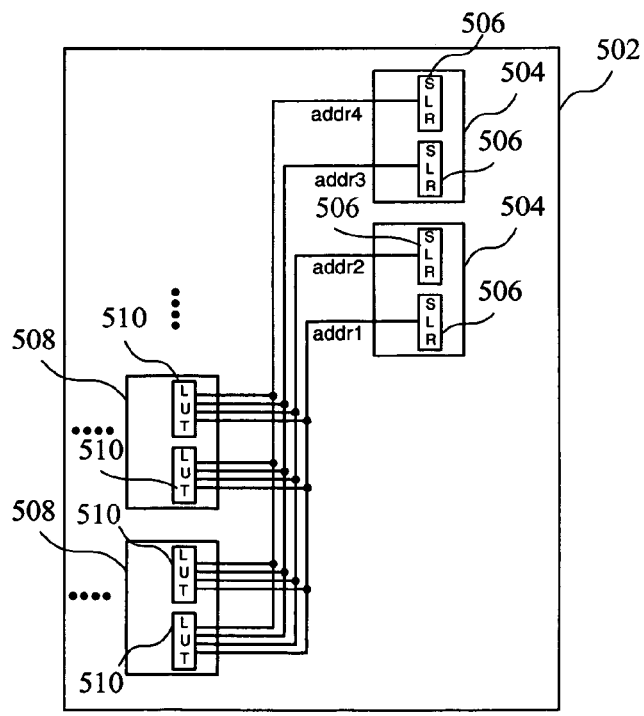
FIG. 5 is a block diagram of the configurable logic block of FIG. 4 after reprogramming to reverse the functions of circuit blocks of the configurable logic block.

As shown in the embodiment of FIG. 4, the configurable logic block 402 is shown as having a pair of load slices 404, where each load slice has a pair of lookup tables 406, and a pair of source slices 408, where each source slice has a pair of shift registers 410. According to another aspect of the invention, the source slices and the load slices could be reversed, as shown in FIG. 5. That is, the configurable logic block is reconfigured so that the load slices become source slices, and the source slices become load slices. In particular, the configurable logic block 502 represents the configurable logic block 402 after being reconfigured. As can be seen, the slices 504 now comprise source slices having shift registers 506, which the slices 508 comprise load slices having lookup tables 510. Accordingly, the circuits of the configurable logic block itself can be used to test all of the various logic cells within the configurable logic block. As will be described in more detail in reference to FIGS. 6 and 7, the circuits of embodiments of the present invention localize and minimize the routing required to test the logic cells, and therefore improve yields for defective but usable integrated circuit die.

Figure 6:
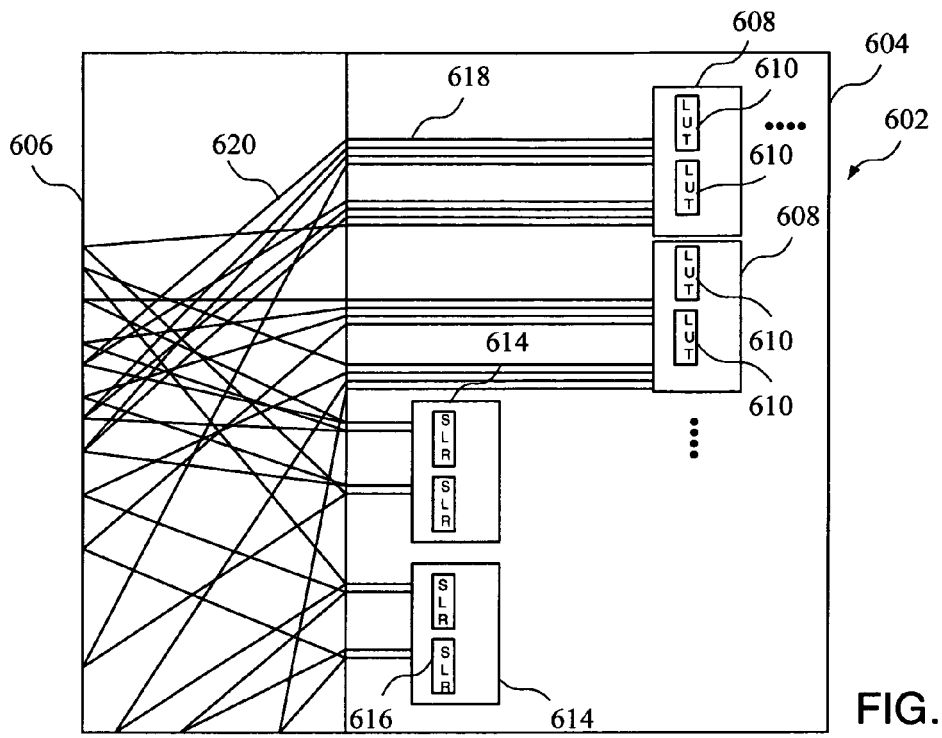
FIG. 6 is a block diagram of a configurable logic block and associated routing connections according to an embodiment of the present invention.

Turning now to FIG. 6, a block diagram of a configurable logic block and associated routing connections according to an embodiment of the present invention is shown. In particular, a block 602 comprises a configurable logic block 604 which is coupled to a local routing block 606, also commonly called a switchbox. A local routing block preferably comprises a multiplexer or plurality of multiplexers for routing one or more inputs to one or more outputs. The local routing block 606 comprises a plurality of multiplexers for routing the outputs, which could be address bits for example, of the shift registers directly to the lookup tables without requiring any generalized routing. The configurable logic block comprises a plurality of load slices 608 having lookup tables 610 and a plurality of source slices 614 comprising a plurality of shift registers 616. The slices are coupled to the local routing block 606 by a plurality of conductors 618, and within the local routing block by conductors 620. The routing shown in FIG. 6 is merely one example of paths for routing between the shift registers and lookup tables. According to one aspect of the circuit of FIG. 6, the routing required to couple addresses from the shift register to the lookup table are provided solely by the local routing block 606. That is, the conductors 620 of the local routing block 606 provide the appropriate connections from the shift registers to the lookup tables. If a lookup table appears to be defective, the path from the shift register to the lookup table could be re-routed within the local routing block 606 to determine whether the defect is in the routing or in the lookup table.

Figure 7:
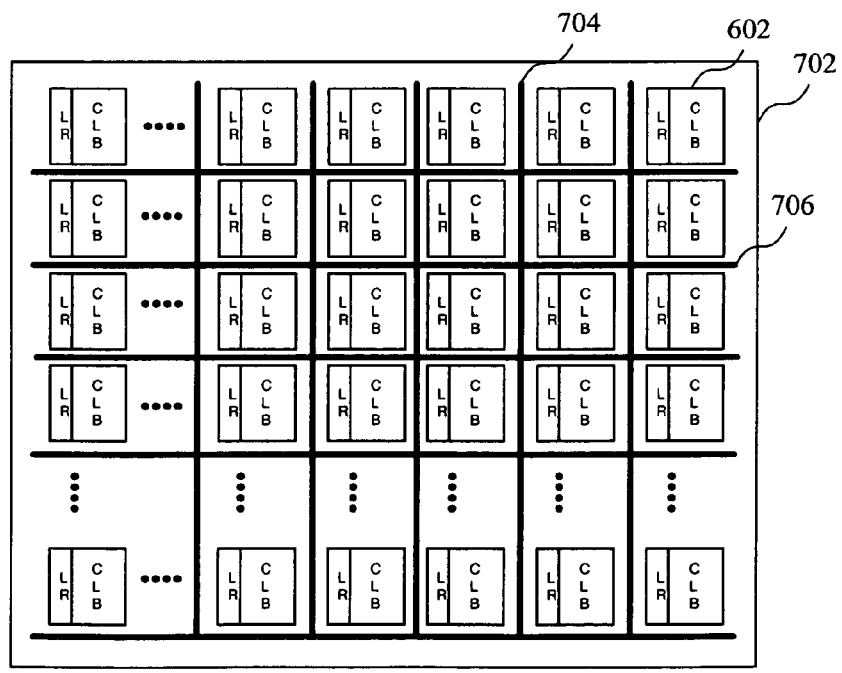
FIG. 7 is a block diagram of a programmable logic device having a plurality of the blocks of FIG. 6 and general routing according to an embodiment of the present invention.

As can be seen in FIG. 7, a plurality of the blocks of FIG. 6 enable the testing of many configurable logic block without using extensive routing resources, as described above. In particular, the testing of circuits such as lookup tables can be accomplished using localized routing (LR), and does not require the use of generalized routing including vertical generalized routing 704 and horizontal generalized routing 706 which is used to route signals between the configurable logic blocks. By using the localized routing, it is not necessary to use the double, hex or long lines of general routing resources described above. That is, the use of generalized routing to test lookup tables could result in unnecessarily rejecting a defective programmable logic device which could be used if tested using the circuits and methods described above.

Figure 8:
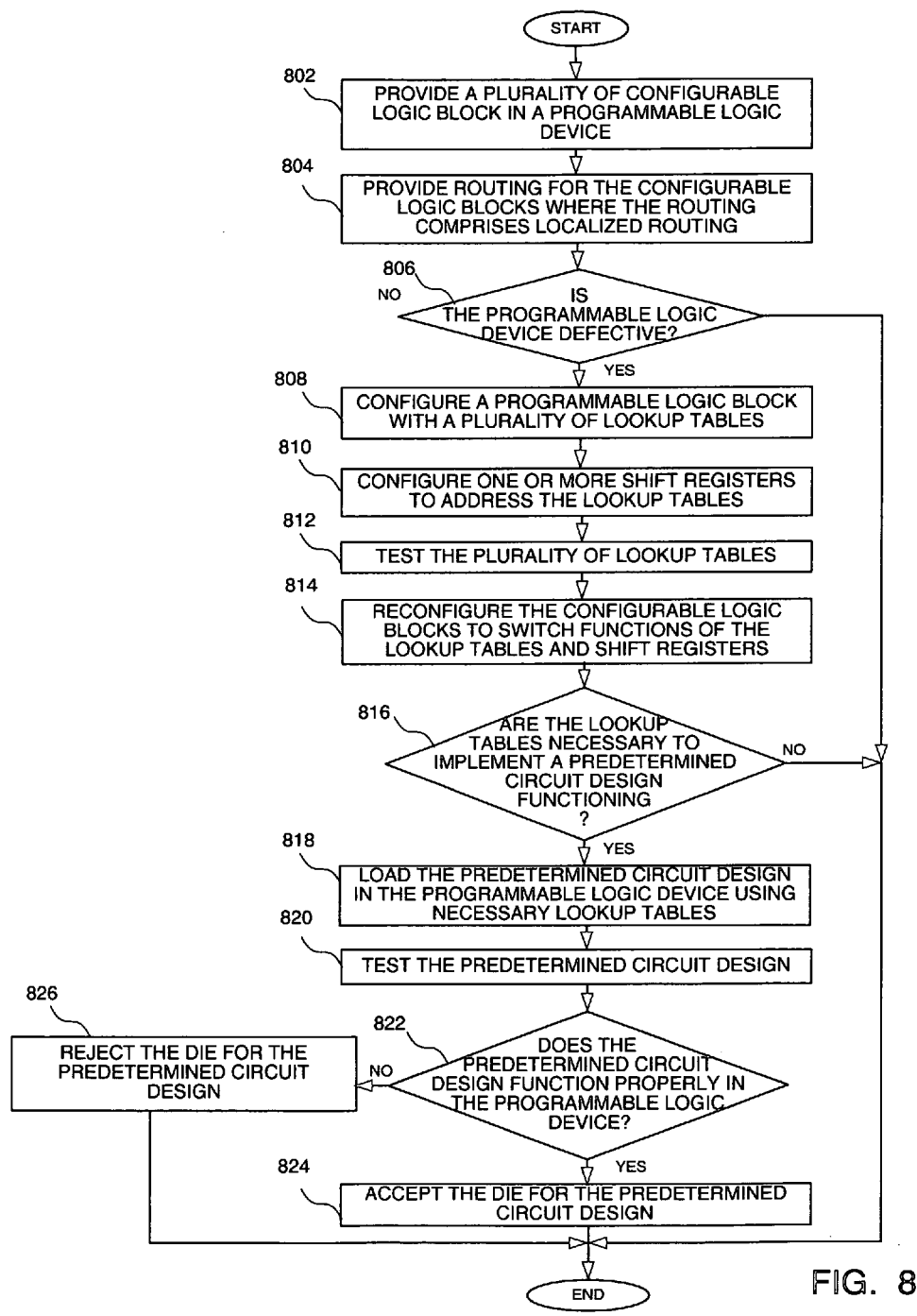
FIG. 8 is a flow chart showing a method of testing circuits in a programmable logic device according to an embodiment the present invention.

Finally, turning to FIG. 8, a flow chart shows a method of testing circuits in a programmable logic device according to an embodiment the present invention. A plurality of configurable logic blocks is provided in a programmable logic device at a step 802. Routing for the configurable logic blocks is provided, where the routing comprises localized routing, at a step 804. It is then determined whether the programmable logic device is defective at a step 806. A method for determining whether a programmable device is defective is described in U.S. Pat. No. 6,664,808, the entire patent of which is incorporated herein by reference. A configurable logic block is then configured with a plurality of lookup tables at a step 808. One or more shift registers are then configured in the configurable logic block to address the lookup tables at a step 810. The plurality of lookup tables are then tested at a step 812. While it is only necessary to test the lookup tables which are required in the customer design, all of the lookup tables could be tested. The configurable logic blocks are then reconfigured to switch functions of the lookup tables and shift registers at a step 814. It is then determined whether the lookup tables necessary to implement a predetermined circuit design are functioning at a step 816.

If the necessary lookup tables are functioning, the predetermined circuit design is then loaded in the programmable logic device using functioning lookup tables at a step 818. The predetermined circuit design is then tested at a step 820. It is then determined whether the predetermined circuit design functions properly in the programmable logic device at a step 822. If the circuit design functions properly, the die is accepted for the predetermined circuit design at a step 824. Otherwise, the die for the predetermined circuit design is rejected at a step 826. The method of FIG. 8 could be performed using the circuit arrangements of FIGS. 2-7, or some other suitable circuits.

It can therefore be appreciated that the new and novel method of testing circuit blocks of a programmable logic device has been described. It will be appreciated by those skilled in the art that numerous alternatives and equivalents will be seen to exist which incorporate the disclosed invention. For example, although shift registers and lookup tables are described by way of example, the methods described above could be used to test any type of circuit implemented in a configurable logic block of a programmable logic device. As a result, the invention is not to be limited by the foregoing embodiments, but only by the following claims.

The invention claimed is:

1. A method of testing circuits in a programmable logic device comprising a plurality of configurable logic blocks, each configurable logic block having a plurality of logic circuits which may be selectively configured as one of a shift register functioning as a source of test data or a lookup table functioning as a load receiving test data and programmable interconnect elements connecting said plurality of logic circuits, said method comprising the steps of:

configuring a configurable logic block of said programmable logic device with a test signal source comprising a first logic circuit functioning as a shift register, said first logic circuit outputting test data comprising address data;

configuring said configurable logic block with a second logic circuit functioning as a lookup table;

storing data in said first logic circuit functioning as a shift register;

routing an output of said first logic circuit of said test signal source to an input of said second logic circuit using programmable interconnect elements of said configurable logic block;

coupling said address data from said first logic circuit to an input of said second logic circuit, said address data comprising data of a plurality of combinations of input bits for accessing said lookup table;

monitoring an output of said second logic circuit for each combination of said plurality of combinations of input bits; and determining if said second logic circuit is defective in response to monitoring said output of said second logic circuit.

2. The method of claim 1 wherein said step of configuring said configurable logic block with a second logic circuit comprises a step of configuring a logic circuit comprising a plurality of lookup tables.

3. The method of claim 2 wherein said step of configuring a configurable logic block comprises a step of configuring a test source comprising a plurality of shift registers.

4. The method of claim 3 further comprising a step of reversing the functions of the circuits configured as said plurality of lookup tables and said plurality of shift registers.

5. The method of claim 1 further comprising a step of configuring said programmable logic device with a predetermined circuit design.

6. The method of claim 5 further comprising a step of testing said programmable logic device configured with said predetermined circuit design.

7. A method of testing circuits in a programmable logic device comprising a plurality of configurable logic blocks, each configurable logic block having a plurality of logic circuits which may be selectively configured as one of a shift register functioning as a source of test data or a lookup table functioning as a load receiving test data and programmable interconnect elements connecting said plurality of logic circuits, said method comprising the steps of:

configuring a first subdivision of a configurable logic block of said programmable logic device with a shift register, said shift register outputting test data comprising address data;

configuring a second subdivision of the configurable logic block with a lookup table receiving said address data from said shift register;

routing said address data from an output of said shift register to an input of said lookup table using programmable interconnect circuits of said configurable logic block, said address data comprising data of a plurality of combinations of input bits for accessing said lookup table;

monitoring an output of said lookup table for said plurality of combinations of input bits to detect an incorrect output of said lookup table;

re-routing said address data from said shift register to said lookup table if an incorrect output of said lookup table is detected; and determining if said lookup table is defective in response to monitoring the output of said lookup table.

8. The method of claim 7 wherein said step of configuring a second subdivision of said configurable logic block comprises a step of configuring a load circuit of said configurable logic block with a plurality of look-up tables.

9. The method of claim 8 wherein said step of configuring a first subdivision of said configurable logic block comprises a step of configuring a source circuit with a plurality of shift registers.

10. The method of claim 7 wherein said step of configuring a first subdivision of a configurable logic block of said programmable logic device comprises a step of configuring a number of shift registers equal to the number of bits required to address said lookup table.

11. The method of claim 10 further comprising a step of reconfiguring said configurable logic block to reverse the functions of said lookup table and said number of shift registers.

12. The method of claim 11 further comprising a step of determining if a second lookup table of said second subdivision is unused.

13. The method of claim 12 further comprising a step of re-routing said plurality of shift registers to said second lookup table if said lookup table of said second subdivision is determined to be defective.

14. A method of testing circuits in a programmable logic device comprising a plurality of configurable logic blocks, each configurable logic block having a plurality of logic circuits which may be selectively configured as one of a shift register functioning as a source of test data or a lookup table functioning as a load receiving test data and programmable interconnect elements connecting said plurality of logic circuits, said method comprising the steps of:

configuring a configurable logic block of said programmable logic device with logic circuits comprising a plurality of shift registers and a plurality of lookup tables;

routing, for each lookup table of said configurable logic block, an output of a shift register of said plurality of shift registers to an input of a lookup table using programmable interconnect elements of said configurable logic block;

coupling test data comprising addresses from each register of said plurality of shift registers to inputs of said plurality of lookup tables, said addresses comprising data for a plurality of combinations of input bits for accessing said plurality of lookup tables;

monitoring outputs of said plurality of lookup tables for said plurality of combinations of input bits; and determining defective lookup tables of said plurality of lookup tables in response to monitoring said outputs of said plurality of lookup tables.

15. The method of claim 14 wherein said step of routing an output of a shift register of said plurality of shift registers to an input of a lookup table comprises a step of routing using a common switchbox.

16. The method of claim 14 further comprising a step of configuring a plurality of configurable logic blocks with a plurality of shift registers and a plurality of lookup tables.

17. The method of claim 16 wherein said step of configuring a plurality of configurable logic blocks with a plurality of shift registers and a plurality of lookup tables comprises a step of loading a plurality of source circuits and a plurality of load circuits.

18. The method of claim 17 wherein said step of routing an output of a shift register of said plurality of shift registers to an input of a lookup table using programmable interconnect elements of said configurable logic block comprises a step of providing routing, for each configurable logic block, by way of a common switchbox.

19. The method of claim 14 further comprising a step of configuring said configurable logic block with a circuit design.

20. The method of claim 19 further comprising a step of testing said circuit design.

* * * * *